US011600660B2

United States Patent
Xiao et al.

(10) Patent No.: US 11,600,660 B2
(45) Date of Patent: Mar. 7, 2023

(54) BOTTOM-PINNED MAGNETIC RANDOM ACCESS MEMORY HAVING A COMPOSITE SOT STRUCTURE

(71) Applicants: Rongfu Xiao, Dublin, CA (US); Yimin Guo, San Jose, CA (US); Jun Chen, Fremont, CA (US)

(72) Inventors: Rongfu Xiao, Dublin, CA (US); Yimin Guo, San Jose, CA (US); Jun Chen, Fremont, CA (US)

(*) Notice: Subject to any disclaimer, the term of this patent is extended or adjusted under 35 U.S.C. 154(b) by 57 days.

(21) Appl. No.: 16/849,571

(22) Filed: Apr. 15, 2020

(65) Prior Publication Data
US 2021/0327960 A1 Oct. 21, 2021

(51) Int. Cl.
*G11C 11/16* (2006.01)
*H01L 27/22* (2006.01)
*H01L 43/08* (2006.01)
*H01L 43/02* (2006.01)
*H01L 43/12* (2006.01)

(52) U.S. Cl.
CPC .......... *H01L 27/226* (2013.01); *G11C 11/161* (2013.01); *G11C 11/1675* (2013.01); *H01L 43/02* (2013.01); *H01L 43/08* (2013.01); *H01L 43/12* (2013.01)

(58) Field of Classification Search
CPC ....... H01L 43/02; H01L 27/226; H01L 43/08; H01L 43/10; H01L 43/12; G11C 11/161; G11C 11/1675
USPC ....................................................... 257/421
See application file for complete search history.

(56) References Cited

U.S. PATENT DOCUMENTS

| | | | |
|---|---|---|---|
| 9,953,692 B1* | 4/2018 | Mihajlovic | G11C 11/1675 |
| 10,748,562 B1* | 8/2020 | Chen | G01R 33/093 |
| 2019/0058111 A1* | 2/2019 | Shibata | G11C 11/161 |
| 2019/0074123 A1* | 3/2019 | Sasaki | H01L 43/06 |
| 2019/0074124 A1* | 3/2019 | Ishitani | H01F 10/3254 |
| 2019/0304524 A1* | 10/2019 | Oguz | H01L 43/02 |
| 2019/0363244 A1* | 11/2019 | Sasaki | H01L 43/06 |
| 2021/0074344 A1* | 3/2021 | Hu | H01F 10/329 |
| 2021/0142823 A1* | 5/2021 | Chen | G11B 5/3146 |
| 2021/0327960 A1* | 10/2021 | Xiao | G11C 11/1675 |
| 2021/0328134 A1* | 10/2021 | Guo | G11C 11/161 |

* cited by examiner

Primary Examiner — Jami Valentine Miller

(57) ABSTRACT

An ultra-fast magnetic random access memory (MRAM) comprises a three terminal bottom-pinned composite SOT magnetic tunneling junction (bCSOT-MTJ) element including (counting from top to bottom) a magnetic flux guide (MFG) having a very high magnetic permeability, a spin Hall channel (SHC) having a large positive spin Hall angle, an in-plane magnetic memory (MM) layer, a tunnel barrier (TB) layer, and a magnetic pinning stack (MPS) having a synthetic antiparallel coupling pinned by an antiferromagnetic material. The magnetic writing is significantly boosted by a combined effort of enhanced spin orbit torque (SOT) and Lorentz force generated by current-flowing wire (CFW) in the SHC layer and spin transfer torque (STT) by a current flowing through the MTJ stack, and further enhanced by a magnetic close loop formed at the cross section of MFG/SHC/MM tri-layer. Such bCSOT-MTJ element will have a very fast (down to picoseconds) switching speed and consume much less power suitable level 1 or 2 cache application for SMRAM, CPU, GPU and TPU.

20 Claims, 7 Drawing Sheets

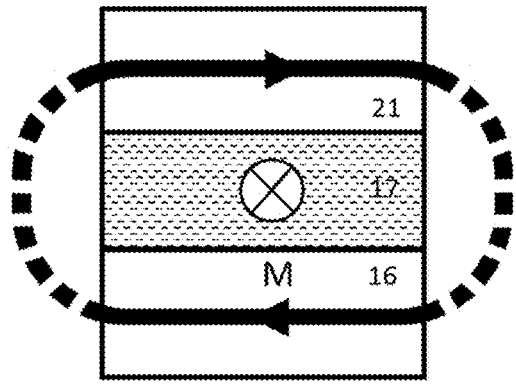
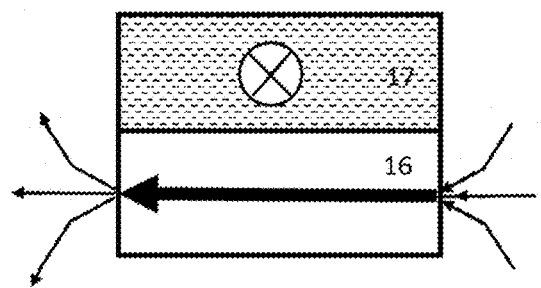
Fig.6A        Fig.6B
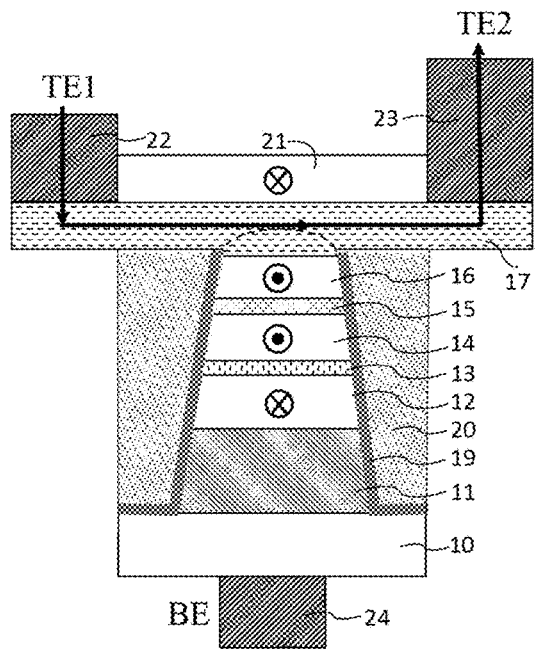
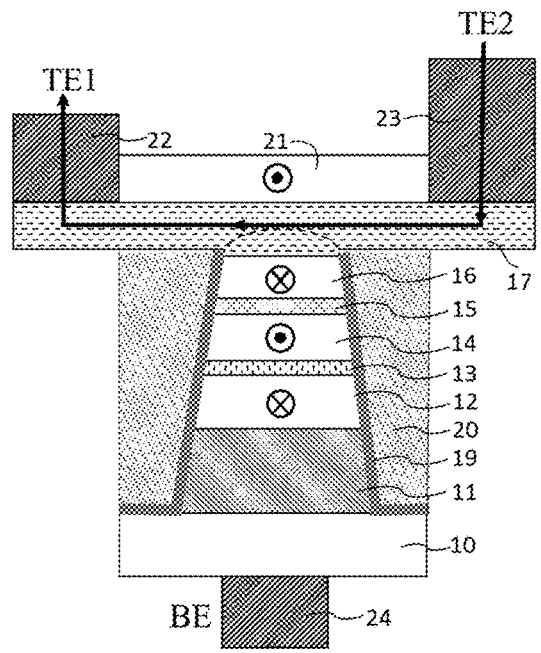
Fig. 7A        Fig. 7B

BOTTOM-PINNED MAGNETIC RANDOM ACCESS MEMORY HAVING A COMPOSITE SOT STRUCTURE

BACKGROUND OF THE INVENTION

1. Field of the Invention

This invention relates to a magnetic random access memory having a composite SOT structure with a magnetic flux guide in immediate proximity to a spin Hall channel and a bottom-pinned MTJ stack.

2. Description of the Related Art

In recent years, magnetic random access memories (hereinafter referred to as MRAMs) using the magnetoresistive effect of magnetic tunnel junctions (also called MTJs) have been drawing increasing attention as the next-generation solid-state nonvolatile memories that can also cope with high-speed reading and writing. A typical magnetic tunnel junction has a three-layer stack structure formed by stacking a recording layer having a changeable magnetization direction, an insulating tunnel barrier layer, and a fixed layer that is located on the opposite side from the recording layer and maintains a predetermined magnetization direction. Corresponding to the parallel and anti-parallel magnetic states between the recording layer magnetization and the reference layer magnetization, the magnetic memory element has low and high electrical resistance states, respectively. Accordingly, a detection of the resistance allows a magnetoresistive element to provide information stored in the magnetic memory device.

Typically, MRAM devices are classified by different write methods. A traditional MRAM is a magnetic field-switched MRAM utilizing electric line currents to generate magnetic fields and switch the magnetization direction of the recording layer in a magnetoresistive element at their cross-point location during the programming write. A spin-transfer torque (or STT)-MRAM has a different write method utilizing electrons' spin momentum transfer. Specifically, the angular momentum of the spin-polarized electrons is transmitted to the electrons in the magnetic material serving as the magnetic recording layer. According to this method, the magnetization direction of a recording layer is reversed by applying a spin-polarized current to the magnetoresistive element. As the volume of the magnetic layer forming the recording layer is smaller, the injected spin-polarized current to write or switch can be also smaller.

To record information or change resistance state, typically a recording current is provided by its CMOS transistor to flow in the stacked direction of the magnetoresistive element, which is hereinafter referred to as a "vertical spin-transfer method." Generally, constant-voltage recording is performed when recording is performed in a memory device accompanied by a resistance change. In a STT-MRAM, the majority of the applied voltage is acting on a thin oxide layer (tunnel barrier layer) which is about 10 angstroms thick, and, if an excessive voltage is applied, the tunnel barrier breaks down. More, even when the tunnel barrier does not immediately break down, if recording operations are repeated, the element may still become nonfunctional such that the resistance value changes (decreases) and information readout errors increase, making the element un-recordable. Furthermore, recording is not performed unless a sufficient voltage or sufficient spin current is applied. Accordingly, problems with insufficient recording arise before possible tunnel barrier breaks down.

Reading STT MRAM involves applying a voltage to the MTJ stack to discover whether the MTJ element states at high resistance or low. However, a relatively high voltage needs to be applied to the MTJ to correctly determine whether its resistance is high or low, and the current passed at this voltage leaves little difference between the read-voltage and the write-voltage. Any fluctuation in the electrical characteristics of individual MTJs at advanced technology nodes could cause what was intended as a read-current, to have the effect of a write-current, thus reversing the direction of magnetization of the recording layer in MTJ.

It has been known that a spin current can, alternatively, be generated in non-magnetic transition metal material by a so-called Spin Hall Effect (SHE), in which spin-orbit coupling causes electrons with different spins to deflect in different directions yielding a pure spin current transverse to an applied charge current. Recently discovered Giant Spin Hall Effect (GSHE), the generation of large spin currents transverse to the charge current direction in specific high-Z metals (such as Pt, $\beta$-Ta, $\beta$-W, doped Cu) is a promising solution to the voltage/current scaling down with semiconductor technology node and reliability problems in a spin-orbit-torque (SOT) MRAM.

One major source of SHE comes from spin-dependent scatterings in a thin non-magnetic transition metal layer, called Spin Hall Channel (SHC), in the presence of spin-orbital coupling. In another word, an electron scattering becomes spin-dependent when the spin-orbital interaction connected the spin of the electron gas to a spin particle outside of the equilibrium of the electron gas. When an electrical current is applied along the SHC, a transverse spin polarized current generated along the thickness direction leads to accumulations of oppositely polarized spins near the two surfaces of the SHC, respectively. However, the polarized spin gradient between the two surfaces starts to cause spin diffusions and it finally reaches a balanced amount of oppositely polarized spins near the two surfaces. Such a metallic layer or wire having a capability of large amount of spin accumulation at surfaces is also called SOT layer when it combines with an MTJ to form a memory cell or element. The parameter describing the efficiency of the spin-to-charge current conversion is the spin Hall angle. SOT-MRAM devices feature switching of the free magnetic layer immediately adjacent to a SOT layer, which is caused by the transverse spin polarized current across the free-layer-SOT-layer interface generated by injecting an in-plane electrical current in the adjacent SOT layer, unlike STT-MRAM where the electrical current is injected perpendicularly into the magnetic tunnel junction and the read and write operation is performed through the same path. Due to the thermal stability requirement, the recording layer is typically is patterned into an oval or ellipse like shape with an aspect ratio larger than 1.5 for a desired uni-axial shape anisotropy so that the magnetization of the recording layer has two stable energy minimum states. A spin torque coming from the Spin Hall Effect (SHE) has to be large enough to overcome a large energy barrier to switch the magnetization of the recording layer from one energy minimum state to the other energy minimum state, depending upon the spin Hall current direction.

Defining +x as the SHC wire longitudinal direction (positive electrical current flowing direction), +y as the SHC wire width direction and +z as direction normal to the film surface. There are three types of SOT-MRAMs (called type x, type y, and type z) where the relationship between magnetization easy axis direction and channel current direction differs. Among the three types of devices, magnetic-field-free switching can be achieved in only the y-type, in which the easy axis direction is in-plane and perpendicular to channel current direction; while in the other two devices, one needs to apply either in-plane or out-of-plane external magnetic field for z-type and x-type devices, respectively. To achieve free-field switching, one way is to pattern the memory cell into an oval shape with its main long axis canted with an angle away from the current flowing direction (see *J. Low Power Electron. Appl.* 2018, 8, 44), and other way is to put part of the memory layer below the current flowing layer (see U.S. Pat. No. 9,941,468). Unfortunately, neither of these methods can help to improve switching speed while reducing writing current, which is urgently needed for ultra-fast and low power device application.

Until now all SOT-MRAM devices are built on an architecture of top-pinned manner, i.e., magnetic pinning layer for the MTJ is located at the bottom and the recording or memory layer is on the top. The drawback of such top-pinned SOT-MRAM is a very weak magnetic stability due to a small footprint of the pinning layer. It is unlikely that such top-pinned SOT-MRAM can find mass device applications before this problem is solved.

BRIEF SUMMARY OF THE PRESENT INVENTION

The invention discloses a bottom-pinned MRAM with composite SOT magnetic tunneling junction (CSOT-MTJ) element comprising (counting from top to bottom) a magnetic flux guiding (MFG) layer having a very high magnetic permeability, a spin Hall channel (SHC) having a large positive spin Hall angle, an in-plane magnetic memory (MM) layer, a tunnel barrier (TB) layer, and a magnetic pinning stack (MPS) having a synthetic antiparallel coupled tri-layer magnetically pinned by an antiferromagnetic material. An ultra-fast magnetic writing (recording) is achieved by a combined effort of enhanced spin orbit torque (SOT) from the composite SOT, Lorentz force generated by current-flowing wire (CFW) of the SHC and further boosted by spin transfer torque (STT) from the MTJ stack. Its thermal stability is enhanced by a close magnetic loop across the MM/SHC/MFG tri-layer. The MFG layer also serves as a magnetic shield to reduce the magnetic stray field among neighboring elements. Here and thereafter throughout this application, each element written in the left side of "/" is stacked below an element written in the right side thereof.

Two methods of symmetry-breaking can be used to avoid using an external magnetic field for initial switch: In the first method, as-deposited SOT-MTJ film stack is annealed with a magnetic field aligning at a canted angle in X-Y plane, while in the second method, the SOT-MTJ recording cell is patterned into an oval shape with its long axis aligning at a canted angle in X-Y plane. The magnetization direction of the MM layer is reversible along its total anisotropy axis and two stable resistance states of the MTJ cell serve as "0" or "1" memory states.

An MRAM device comprises an array of CSOT-MTJ elements as well as a control circuitry. While main writing circuit between the two bottom electrodes (BE1 and B2) requires at least one transistor, read circuit can use a diode at the top electrode to save physical space for device miniaturization. Such a novel MRAM device will not only have an ultra-high switching speed, but also consume less power with a small size, suitable for level 1 or 2 cache applications in SMRAM, CPU, GPU and TPU.

BRIEF DESCRIPTION OF THE DRAWINGS

FIG. 6A Illustration of magnetic flux for the memory layer with a MFG layer to cover the SHC, the magnetic flux in MM layer 16 forms a close loop without a MFG layer.

FIG. 6B Illustration of a diverging magnetic flux outside the memory layer without a MFG layer.

DETAILED DESCRIPTION OF THE INVENTION

Figure 1:
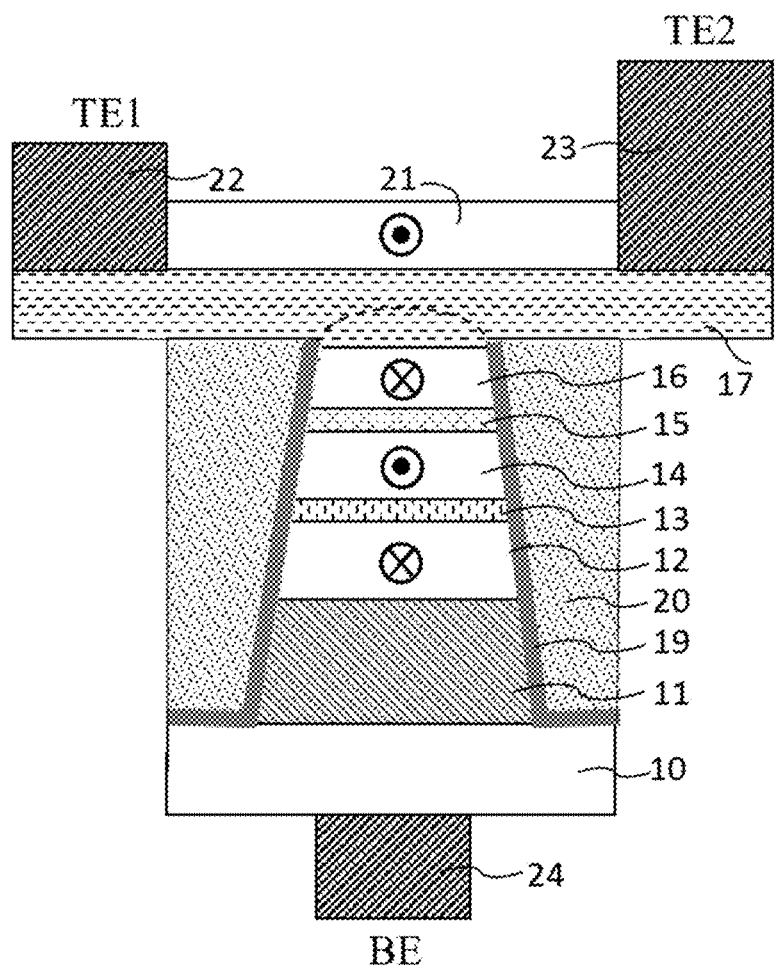
FIG. 1 Cross section view (in X-direction) of a finished bottom-pinned bCSOT-MTJ with two top electrodes (TE1 and TE2) and one bottom electrode (BE).

The disclosed three terminal bottom-pinned composite SOT magnetic random access memory (bCSOT-MRAM) comprises a film element of (see FIG. 1) (counting from device bottom to top) a seed layer 10, a magnetic pinning stack (MPS) (layer 11-14), a tunnel barrier (TB) 15, a magnetic memory layer (MM) 16, a composite SOT (CSOT) stack and including a spin Hall channel (SHC) layer 17 and a magnetic flux guiding (MFG) layer 21, and said film element after patterning and etching is protected by a SiN 19 layer layer and SiO2 dielectrics 20 and electrically connected to two top electrodes TE1 and TE2 which are located respectively at first and second side of said CSOT stack and one bottom electrode (BE). The TE1 is further connected to a transistor and TE2 is normally grounded while BE is either conned to a diode or a transistor.

Above said seed layer 10 is made of a Ta, W, Zr or Hf with a thickness between 2-8 nm which in addition to provide a seed for the growth of said MPS but also act as etching stop during etching process.

Above said magnetic pinning stack (MPS) is a multilayer stack having magnetic anisotropy in a film plane and having an invariable magnetization direction and comprising a an antiferromagnetic material 11 selected from PtMn, PtPdMn, NiMn, IrMn, RhMn, RuMn, a pinned magnetic layer 12 made of Co or CoFe, a RKKY coupling layer 13 made of Ru, Rh or Ir and a reference layer 14 made of Co/CoFeB, Co/FeB, CoFe/CoFeB or CoFe/FeB, and a preferred MPS layer stack is PtMn(5-20 nm)/CoFe(2-5 nm)/Ru(0.4-0.85 nm)/CoFe(1-1.5 nm)/CoFeB(1-2 nm).

Above said tunnel barrier (TB) layer 15 is made of an oxide selected from MgO or MgZnO with a thickness between 1-2 nm. As compared with the MTJ stack used in pSTT-MTAM, in this MTJ stack, a thicker TB can be used to ensure a good device reliability because the write current does not go through the MTJ stack.

Above said magnetic memory (MM) layer 16 is made of a soft magnetic single layer or multilayer having a magnetic anisotropy in a direction in the film surface and having a variable magnetization direction; and comprising a material selected from CoFeB, FeB, Fe/CoFeB, CoFe/CoFeB, CoFeB/CoFe with a total thickness between 1.5-5 nm or a multilayer CoFeB(1-2 nm)/(W or Mo)(0.2-0.6 nm)/CoFeB (0.5-3 nm).

Above said spin Hall channel (SHC) 17 is made of a material having a large positive spin Hall angle, preferred to be selected from the group of (Au, Pt, Ir, Ag, Pd or Cu) doped with 5-15% (Ta, W, Hf or Bi), and having an electric resistivity lower than the electric resistivity of said MFG and having a thickness between 1.5-10 nm. Although beta phase Ta and W have a negative large spin Hall angle, the negative spin torque generated will be counter-balanced partially by a Lorentz force generated by the current-flowing wire (CFW) in the SHC layer which will provide a weaker spin torque for memory layer switch. Au-based alloy with Ta or W impurities has an additional advantage with a much lower resistivity (less than 85 μohm·cm) than most SHC materials.

In above said MFG layer 21 is made of a soft magnetic material having a very high magnetic permeability and comprising at least one element selected from the group of Ni, Fe, Co, and preferred to be selected from the group of NiFe, CoFe, NiCo and CoNiFe, or the group of NiFe, CoFe, NiCo, Co and CoNiFe doped with 0-30% of B, Si, Mo, Cr, Nb, Ta, Hf, and having a thickness between 1.5-10 nm. For example, its magnetic permeability is about 1000 or a half of that of Permalloy (Ni81Fe19) and its magnetostriction lamda is also very small ($-2.6 \times 10^{-6}$) while the resistivity of CoNbHf thin film layer is readily larger than 125 μohm·cm, which is larger than that of a SHC made of Au doped with 10% Ta. In this case, most electrical current flows inside the SHC 17, and the accumulation of one type of polarized spins near the top surface of the SHC 17 caused by SHE would also diffuse into the MFG layer 21. This would further lead to not only magnetization rotation of the MFG layer but also more accumulation of the other type of polarized spins near the bottom surface of the SHC 17, both of which would help the switching of the magnetization in the MM layer.

Figure 2:
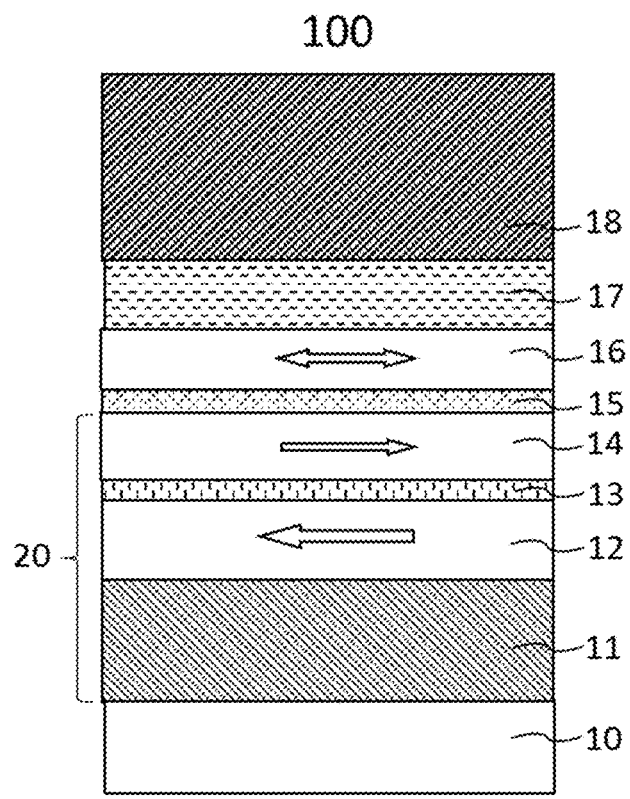
FIG. 2 Film structure of said bCSOT-MTJ stack after deposition.
Figure 3:
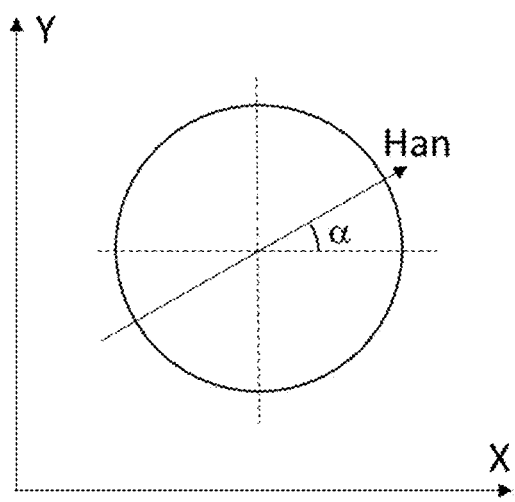
FIG. 3 Canted magnetic annealing (Han) to preset the pinning direction for the MTJ stack at an angle α in X-Y plane.

Fabrication of above said bCSOT-MRAM device is illustrated in a process flow chart which starts on a BE-VIA substrate, deposition of a bottom-pinned bCSOT MTJ film stack 100 as shown in FIG. 2 including seed layer 10/MPS (11-14)/TB(15)/MM(16)/SHC(17) and capped with Ta or W hard mask layer 18. After film deposition, the above said bCSOT-MTJ stack is annealed at a high temperature between 350-400 C for 30-120 minutes in the presence of a high magnetic field Han (1-5Tesla) to preset an initial aligning direction for the entire film stack. The field direction can be canted at an angle α (10-90 degree) within the X-Y plane (see FIG. 3) which is needed to avoid using an external magnetic field during memory switching.

Figure 4:
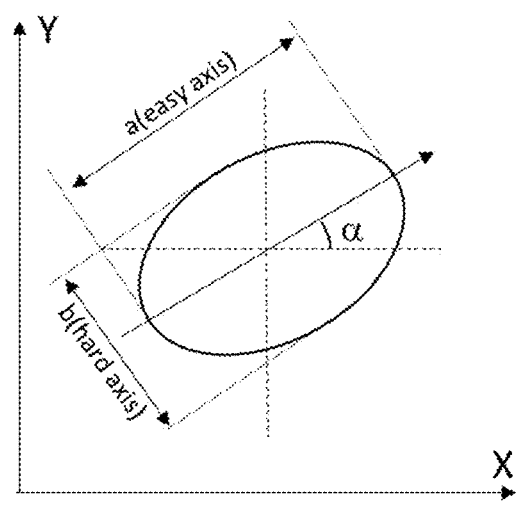
FIG. 4 Patterning of said bCSOT-MTJ element with an oval shape to preset its long axis aligning at an angle α in X-Y plane.

The wafer with a bCSOT-MTJ film stack is then photo-lithographically patterned. To avoid using an external magnetic field during memory switching, the shape of the memory cell can also be made elliptical with an aspect ratio of 1.5-3 for its long(easy)/short (hard) (a/b) axes, and with its long a (magnetic easy) axis pointing (canted) at an angle c ranging between 10 to 90 degree in the X-Y plane (see FIG. 4), said X axis is the current flowing direction and Y is perpendicular to X; a preferred canting angle is 45 degree; wherein said canted annealing is needed to avoid using an external field at beginning of switching process.

Figure 5A:
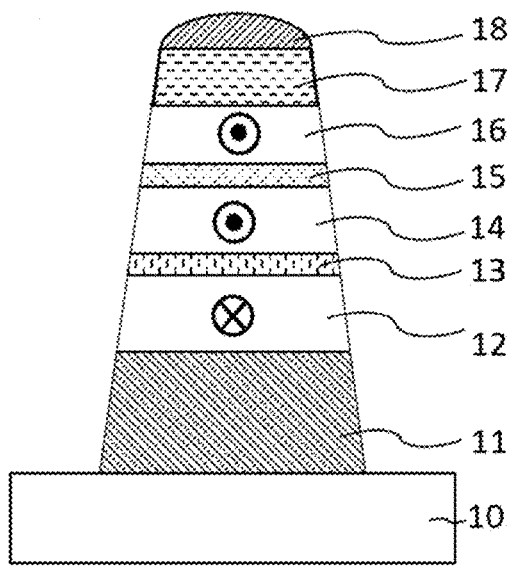
FIG. 5A Cross section view of said bottom-pinned bCSOT-MTJ fabrication showing the SOT-MTJ stack is patterned and etched all through the MTJ stack.
Figure 5B:
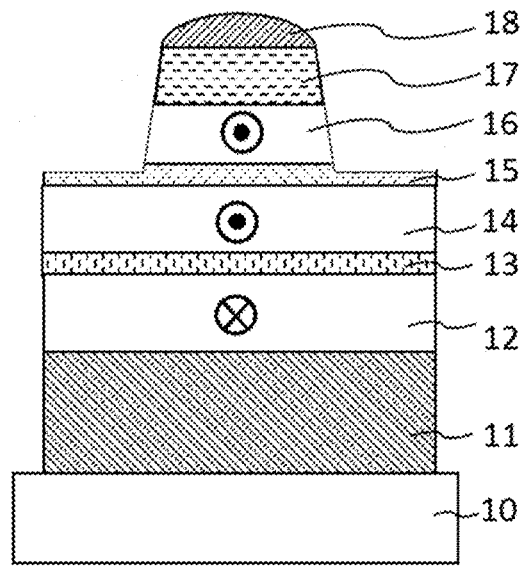
FIG. 5B Cross section view of said bottom-pinned bCSOT-MTJ fabrication showing the SOT-MTJ stack is patterned and etched half way and stopped at MgO.

After photo-patterning the whole bCSOT-MTJ stack is etched using the cap layer 18 as a hard mask. As shown in FIG. 5A the etched SOT-MTJ cross section shows a bigger size at bottom (where the MPS is located) and small at the top (where the MM and SHC are located) which is particularly beneficial for magnetic stability because a larger MPS footprint exhibits a higher blocking temperature for the AFM material and stronger pinning for the pinned magnetic layer. The footprint of the MPS can be further increased by a two-step etch as shown in FIG. 5B in which the first etch stops at MgO and then using another mask to pattern the MPS stack.

Figure 5C:
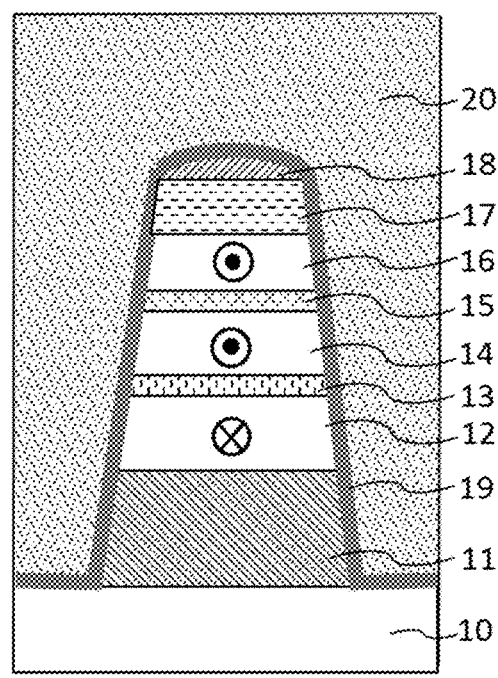
FIG. 5C Cross section view of said bottom-pinned bCSOT-MTJ fabrication showing the SiN protection layer and SiO2 dielectrics are deposited to fill the etched open area.
Figure 5D:
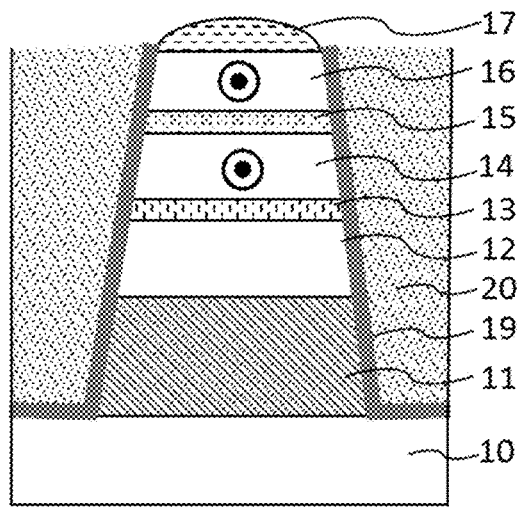
FIG. 5D Cross section view of said bottom-pinned bCSOT-MTJ fabrication showing a CMP is used to open the remaining SHC.
Figure 5E:
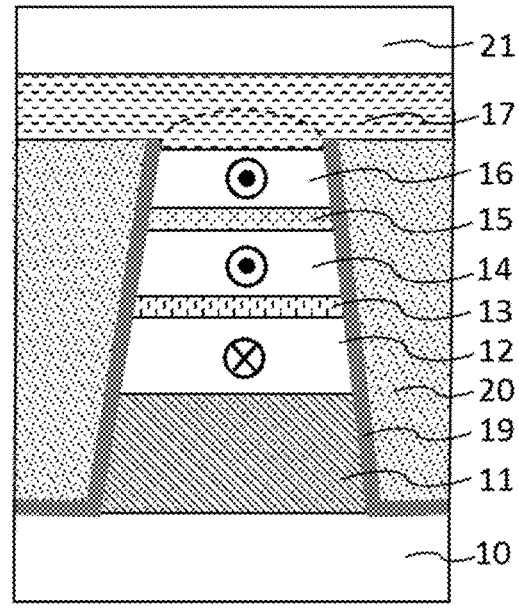
FIG. 5E Cross section view of said bottom-pinned bCSOT-MTJ fabrication showing more SHC material is added and a MFG is deposited on SHC.

Immediately after etching, a SiN protection layer (19) is deposited to cover the exposed SOT-MTJ surface to cover the exposed MTJ surface and subsequently refill with SiO2 (20) (see FIG. 5C). Then a chemical mechanical polishing (CMP) is used to remove the top excess SiO2, SiN cap layer and part of the SHC layer (see FIG. 5D). Then additional SHC material is added to the remaining SHC (after etch) to stitch them together to form a final current flowing channel (see FIG. 5E).

Figure 5F:
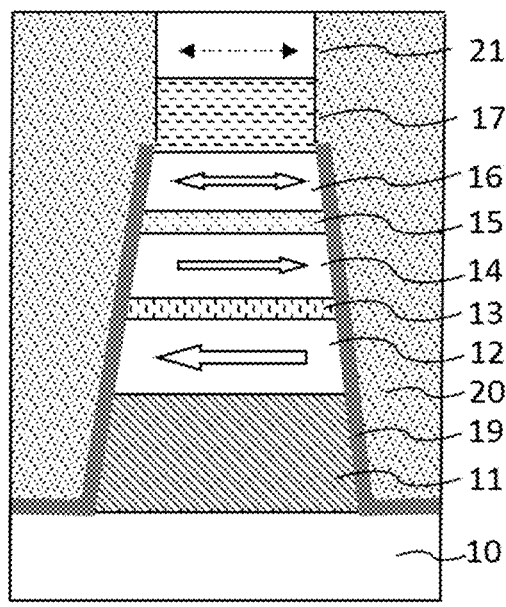
FIG. 5F Cross section view of the patterned and etched SHC and MFG bi-layer in Y-direction.

At this point, there are two options for the formation of final composite SOT channel: In option-1, the magnetic flux guiding (MFG) layer is deposited after the SHC deposition without vacuum break, and a subsequent new patterning and etching form a final sandwiched MM/SHC/MFG tri-layer CSOT stripe as shown in FIG. 5F (cross section view normal the CSOT stripe); While in option-2, the SHC layer is first patterned and etched to form a bare SHC channel, then deposit a layer of MFG material around the exposed SHC surface in all etched exposed sides to form a wrap-around MFG cladding (see FIG. 5G). The beneficial of option 2 will be seen in the following discussion.

After formation of the CSOT stripe, two top electrodes (TE1 and TE2) are formed on top of the CSOT with TE1 located at one side (22) and the TE2 at the other side (23) of CSOT stripe (see FIG. 1) in which TE1 is electrically connected to a transistor and TE2 is normally grounded to control the current flowing in the CSOT channel bi-directionally, and one bottom electrode (BE) 24 can be controlled either by a diode or a transistor.

Figure 5G:
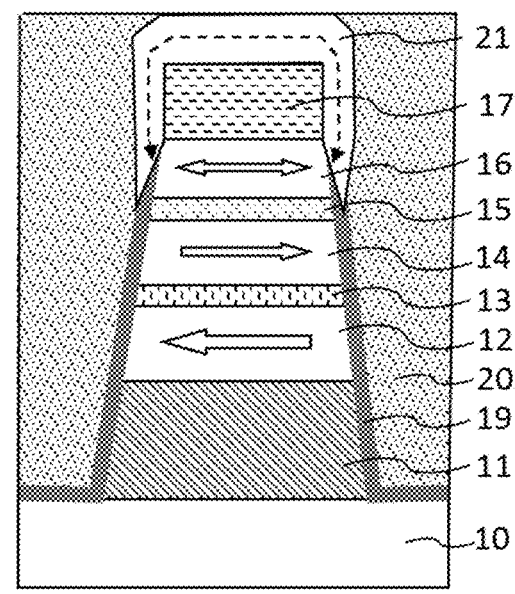
FIG. 5G Cross section view of the patterned and etched SHC and MFG layers with MFG wrapping around the SHC.

In FIG. 1, the two magnetic layers 12 (pinned) and 14 (reference) have their magnetic moment aligned in antiparallel across the Ru RKKY coupling layer 13, and the MM 16 is in an anti-parallel state with the reference layer 14 resulting a high magnetoresistance state, while the MFG layer 21 across the SHC layer 17, due to its magnetic softness and extremely high permeability, is always trying to opposite-align with the MM layer 16 to form a close-loop (see FIG. 6A) to help magnetic switching during memory writing, especially for all-around MFG shape shown FIG. 5G. Without such a MFG layer, the magnetic flux outside the MM layer is diverging (see FIG. 6B) which will make it difficult to switch. And most importantly, with such a magnetic close loop, both the spin orbit torque and Lorentz force generated at the lower MM/SHC interface and upper SHC/MFG interface will participate in the switching of the MM layer, more than twice magnitude of torque compared with the ones generated at the upper SHC/MM interface only.

Figure 7C:
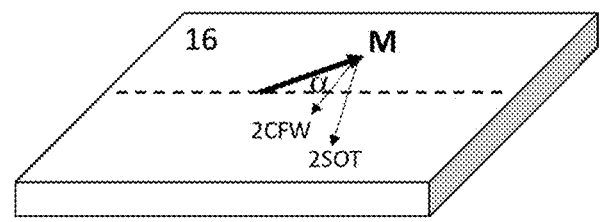
Fig.7A Illustration of magnetic memory writing when a current passing through the SHC layer flowing from TE1 to TE2 to write the memory layer to a low resistance state.
FIG. 7B Illustration of magnetic memory writing when a current passing through the SHC layer flowing from TE2 to TE1 to writes the memory layer to a high resistance state, FIG. 7C Illustration of magnetic memory writing when a current passing through the SHC layer showing the two forces (SOT, CFW) simultaneously acting on the memory layer for a the case shown in FIG. 7A.

In FIG. 7A illustrate magnetic switching in a bCSOT-MTJ when a current is flowing through the SHC from TE1 (22) to TE2 (23), while FIG. 7B is for an opposite case with a current flowing from TE2 to TEL. As shown in FIG. 7C, when a current flowing from TE1 to TE2 in the SHC layer (FIG. 7A), there are 2×SOT and two current flow wire (CFW) generated Lorentz forces (2×CFW) acting on the MM layer 16 to switch its magnetic moment to an anti-parallel state with the reference layer 14. With a small magnetic impedance in the closed magnetic loop as shown in FIG. 6A, magnetic polarization of the MM layer can be easily rotated to its final anti-parallel state. Similarly with an opposite current flow in the SHC layer, the magnetic polarization of the MM will be switched to parallel state with the reference layer (see FIG. 7B).

Figure 8A:
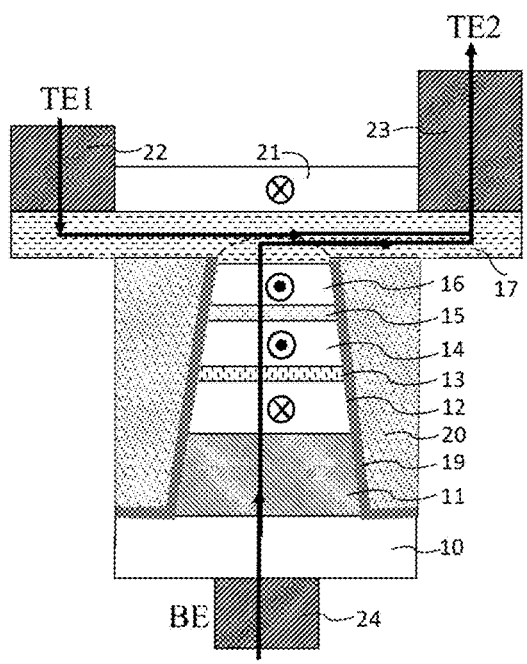
FIG. 8A Illustration of magnetic memory writing with one current laterally flowing through the SHC and another current perpendicularly flowing up from the MTJ stack to write to a low resistance state.
Figure 8B:
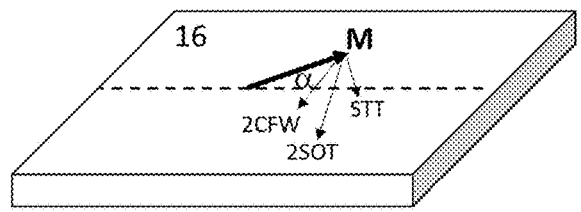
FIG. 8B Illustration of magnetic memory writing showing three forces simultaneously acting on the memory layer to switch its magnetic state.

The magnetic switching of MM layer can be further enhanced by simultaneously passing through a current from bottom electrode (24) to TE2 (see FIG. 8A) utilizing a spin transfer torque (STT) generated by the MTJ stack. Under such a write operation, there are 2SOT+2CFW+STT forces magnetically acting on the MM layer (see FIG. 8B) which make the switching even easier and faster.

Figure 9:
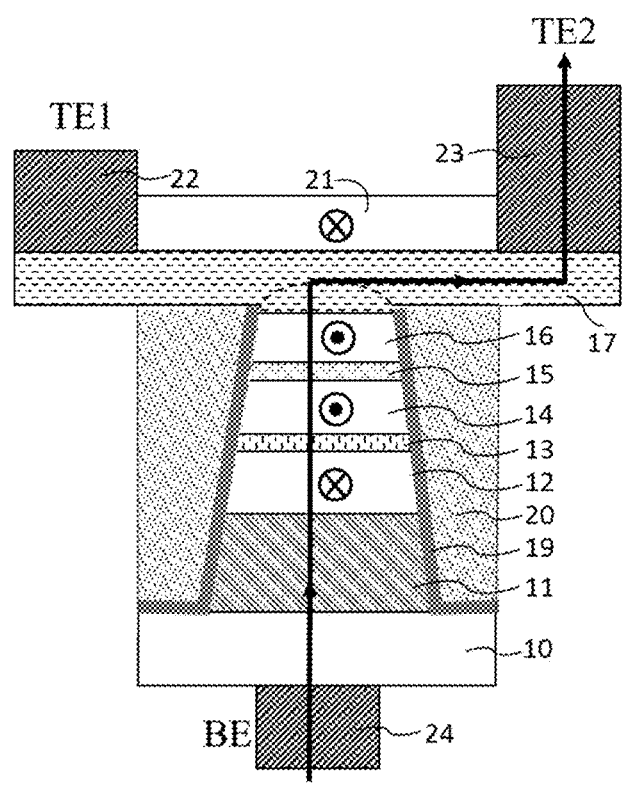
FIG. 9 Current flow from bottom electrode (BE) through the MTJ to TE2 during memory reading.

As for read operation, a current will pass through the MTJ stack from bottom electrode (24) up to TE2 (23) (see FIG. 9). For the control of current flow, either a transistor or diode can be used for such operation. From the point of device miniaturization and cost of manufacturing, using a diode is more economic, thus only on transistor one diode (1T1D) is needed for each CSOT-MTJ unit.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

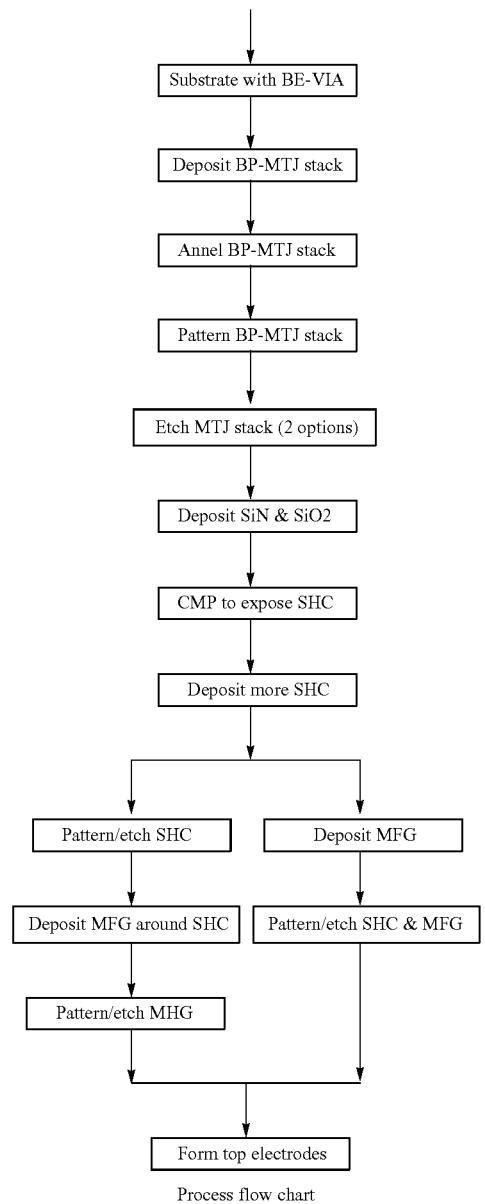

Process flow chart

The invention claimed is:

1. A bottom-pinned composite spin-orbit torque (SOT) magnetic tunneling junction (bCSOT-MTJ) element comprises
    a seed layer (SL) provided on a bottom-electrode (BE) VIA substrate;
    a magnetic pinning stack (MPS) provided on the top surface of said SL having magnetic anisotropy in a film plane and having an invariable magnetization direction;
    a tunnel barrier (TB) layer provided on the top surface of said MPS;
    a magnetic memory (MM) layer provided on the top surface of said TB and having magnetic anisotropy in a film plane and having a variable magnetization direction;
    a composite SOT (CSOT) stack comprising:
        a spin Hall channel (SHC) layer provided on the top surface of said MM layer; and a magnetic flux guiding (MFG) layer on one of the top surface of said SHC, and both the top surface and side walls of said SHC.

2. The element of claim 1, wherein said MFG layer comprises a soft magnetic material having a very high magnetic permeability and comprising at least one element selected from the group of Ni, Fe, Co, and preferred to be selected from the group of NiFe, CoFe, NiCo, CoNiFe, and alloys thereof doped with a dopant having an atomic percentage less than 30% and comprising an element selected from B, Si, Mo, Cr, Nb, Ta, Hf, and having a thickness between 1.5 nm and 10 nm.

3. The element of claim 1, wherein said SHC comprises a spin Hall material having a large positive spin Hall angle, preferred to comprise a nobel metal selected from Au, Pt, Ir, Ag, Pd, Cu and doped with a dopant having an atomic percentage between 5% and 15% and comprising an element selected from Ta, W, Hf, and having an electric resistivity lower than the electric resistivity of said MFG and having a thickness between 1.5 nm and 10 nm.

4. The element of claim 1, wherein said MM is made of a soft magnetic layer having a magnetic anisotropy in a direction in the film surface and having a variable magnetization direction; and comprising at least one element selected from the group of Co, Fe, Ni and B, preferred to be selected from CoFeB, FeB, Fe/CoFeB, CoFe/CoFeB, CoFeB/CoFe, CoFeB/W/CoFeB, CoFeB/Mo/CoFeB, and having a total thickness between 1.5 nm and 5 nm.

5. The element of claim 1, wherein said TB is made of an oxide layer selected from MgO and MgZnO, and having a thickness between 0.7 nm and 2 nm.

6. The element of claim 1, wherein said MPS is a multilayer stack having magnetic anisotropy in a film plane and having an invariable magnetization direction and comprising a magnetic reference layer selected from CoFeB/Co, FeB/Co, CoFeB/CoFe, FeB/CoFe, a RKKY coupling layer selected from Ru, Rh, Ir, a pinned layer selected from Co, CoFe, and an antiferromagnetic material layer selected from PtMn, PtPdMn, NiMn, IrMn, RhMn, RuMn; and said MPS is preferred to be CoFeB(1-2 nm)/CoFe(1-1.5 nm)/Ru(0.4-0.85 nm)/CoFe(2-5 nm)/PtMn(5-20 nm).

7. The element of claim 1, wherein said bCSOT-MTJ element further comprises a three-terminal electric circuit having three terminals:
a first top electrode (TE1) provided on a first side of said CSOT stack and connected a control transistor;
a second top electrode (TE2) provided on a second side of said CSOT stack; and
a bottom electrode (BE) provided at the bottom surface of said SL.

8. The element of claim 7, wherein said three-terminal electric circuit provides a first spin current flowing from said TE1 to said TE2 during a high resistance (anti-parallel) state writing of said bCSOT-MTJ element, and provides a second spin current flowing from said TE2 to said TE1 during a low resistance (parallel) state writing of said bCSOT-MTJ element, when said BE remains open.

9. The element of claim 8, wherein both said high (anti-parallel) resistance state writing and said low (parallel) resistance state writing of said bCSOT-MTJ element comprise effects of a spin orbit torque (SOT), a Lorentz force, and a magnetic field produced by a close magnetic flux loop from said MM/SHC/MFG tri-layer.

10. The element of claim 7, wherein said three-terminal electric circuit provides a third spin current flowing from said TE1 to said TE2 and a fourth spin current flowing from said BE down to said TE2 simultaneously during a high (anti-parallel) resistance state writing of said bCSOT-MTJ element, and provides a fifth spin current flowing from said TE2 to said TE1 and a sixth spin current flowing from said BE up to said TE2 simultaneously during a low resistance (parallel) state writing of said bCSOT-MTJ element.

11. The element of claim 10, wherein both said high resistance state writing and said low resistance state writing of said bCSOT-MTJ element comprise effects of a spin orbit torque (SOT), a Lorentz force, a spin orbit torque (STT), and a magnetic field produced by a close magnetic flux loop from said MM/SHC/MFG tri-layer.

12. The element of claim 7, wherein said three-terminal electric circuit provides a read current flowing from said bottom electrode (BE) up said bCSOT-MTJ element to said TE2 during a magnetic state reading of said bCSOT-MTJ element when said control transistor connecting to said TE1 remains open.

13. A method of manufacturing a bottom-pinned composite SOT magnetic tunneling junction (bCSOT-MTJ) element comprising:
forming a seed layer (SL) on a bottom-electrode (BE) VIA substrate;
forming a magnetic pinning stack (MPS) on the top surface of said SL having magnetic anisotropy in a film plane and having an invariable magnetization direction;
forming a tunnel barrier (TB) layer on the top surface of said MPS;
forming a magnetic memory (MM) layer on the top surface of said TB and having magnetic anisotropy in a film plane and having a variable magnetization direction;
forming a composite SOT (C SOT) stack comprising steps of:
forming a spin Hall channel (SHC) layer on the top surface of said MM layer; and
forming a magnetic flux guiding (MFG) layer on one of the top surface of said SHC, and
both the top surface and side walls of said SHC.

14. The element of claim 13, further comprising conducting an annealing process, wherein said annealing process has an annealing temperature between 350 and 400 C for 30-150 min in the presence of an in-plane magnetic field with a strength between 1 and 5 Tesla aligning (canted) at an angle a ranging from 10 to 90 degree in the X-Y plane, said X axis is the current flowing direction and Y is perpendicular to X; a preferred canting angle is 45 degree.

15. The element of claim 13, between forming said spin Hall channel (SHC) layer and forming said magnetic flux guiding (MFG) layer, further comprising:
conducting a photo-lithographic patterning process;
forming a SiN protection layer;
refilling a SiO2 dielectric layer;
conducting a chemical mechanical polish (CMP) to remove excess SiO2 & SiN until said SHC layer is exposed; and
depositing an additional SHC material on the exposed SHC surface to seamlessly merge them together form a complete spin Hall current channel after forming said SiN protection layer;
wherein said bCSOT-MTJ element is photo-lithographically patterned into an oval shape with an aspect ratio of 1.5-3 for its long/short (a/b) axes by said photo-lithographic process, and having long axis pointing (canted) at an angle a ranging between 10 and 90 degree in the X-Y plane, said X axis is the current flowing direction and Y is perpendicular to X; a preferred canting angle is 45 degree.

16. The element of claim 15, wherein said photo-lithographic patterning process comprises a first patterning and a first etching down to said bottom seed layer (SL) by at least one of reactive ion etch (RIE) and ion-beam etch.

17. The element of claim 15, wherein said SiN protection layer has a thickness between 30 nm and 50 nm, and is deposited in-situ to cover the exposed SOT-MTJ surface right after etching, said SiO2 dielectrics with a thickness thicker than the etched portion of said SOT-MTJ stack.

18. The element of claim 13, after forming said magnetic flux guiding (MFG) layer, further comprising:
  conducting a second patterning and a second etching on said SHC and said MFG to form a composite SOT (CSOT) stripe on the top surface of said magnetic memory layer; and
  forming a first top electrode (TE1) and a second top electrodes (TE2) on the top surface of said CSOT stripe.

19. The element of claim 15, after depositing said additional SHC material, further comprising
  conducting a third patterning and a third etching on said SHC layer.

20. The element of claim 1, wherein said bCSOT-MTJ element is used in application for one of SMRAM, CPU, GPU and TPU.

* * * * *